United States Patent [19]

Ohsawa et al.

[11] 4,398,975

[45] Aug. 16, 1983

[54] CONDUCTIVE PASTE

[75] Inventors: Kenji Ohsawa, Yokohama; Takao Ito; Koichiro Tanno, both of Tokyo; Masayuki Ohsawa; Keiji Kurata, both of Atsugi, all of Japan

[73] Assignee: Sony Corporation, Tokyo, Japan

[21] Appl. No.: 331,229

[22] Filed: Dec. 16, 1981

[30] Foreign Application Priority Data

Dec. 25, 1980 [JP] Japan ................................. 55-184773

[51] Int. Cl.$^3$ ............................................ C22C 28/00
[52] U.S. Cl. ..................................... 148/400; 420/555
[58] Field of Search ................ 75/134 T; 148/3, 400; 420/555

[56] References Cited

U.S. PATENT DOCUMENTS

| 3,141,238 | 7/1964 | Harman, Jr. | 29/498 |
|---|---|---|---|
| 3,157,539 | 11/1964 | Dreher | 148/127 |
| 3,196,007 | 7/1965 | Wikle | 75/200 |
| 4,015,981 | 4/1977 | Rogova et al. | 75/134 B |
| 4,233,103 | 11/1980 | Shaheen | 156/331 |

FOREIGN PATENT DOCUMENTS

| 2526544 | 3/1976 | Fed. Rep. of Germany | 75/169 |
|---|---|---|---|
| 3018874 | 11/1980 | Fed. Rep. of Germany | |
| 236215 | 5/1969 | U.S.S.R. | 75/13 Y |
| 293602 | 2/1971 | U.S.S.R. | 75/13 Y |

Primary Examiner—Michael L. Lewis
Attorney, Agent, or Firm—Hill, Van Santen, Steadman & Simpson

[57] ABSTRACT

A novel conductive paste and a method of making the same in which metallic gallium is combined with a metal or alloy which forms a eutectic with gallium in an amount in excess of its limit of solubility in gallium at a specific temperature. This melt is then treated with a metal powder of a second metal or alloy which alloys with gallium to produce a higher melting alloy, the second metal powder being coated on its surface with the eutectic-forming metal.

10 Claims, 25 Drawing Figures

CONDUCTIVE PASTE

REFERENCE TO RELATED APPLICATION

This application has subject matter in common with U.S. Ser. No. 246,902, filed Mar. 23, 1981, and assigned to the same assignee as the present application.

BACKGROUND OF THE INVENTION

1. Field of the Invention

This invention is in the field of conductive compositions particularly for providing electrical continuity between two surfaces of a printed circuit board. The new composition can also be used as a connecting material between conductive circuit patterns, or for making a conductive pattern.

2. Description of the Prior Art

There are several prior art techniques for providing electrical connection between the individual layers of a multi-layer printed circuit board. In one such technique, an insulating substrate composed of an insulator such as a phenolic resin, an epoxy resin, or the like, is covered with copper foils which are adhered on the upper and lower surfaces thereof to produce a so-called copper clad laminated board. Then, a through-hole is bored at a predetermined location of the board to pass through the board and the copper foils thereon in the vertical direction. The board is then subjected to electroless copper plating and to copper electroplating in sequence to form a copper plating layer on the inner surface of at least the through-hole to thereby electrically connect the upper and lower copper foils. An etching resist is inserted into the through-hole and at the same time the portions which are to form the desired wiring pattern are also covered with etching resists. Next, portions of the copper foils are selectively etched away to leave a multi-layer printed circuit board in which the upper and lower circuit patterns are electrically connected through the through-hole.

A second prior art technique makes use of a copper clad laminated board similar to that described, the board being first subjected to selective etching to form wiring patterns on both surfaces of the insulating substrate. Then, a through-hole is bored through the substrate at a predetermined location, the hole also passing through the wiring patterns. Then, silver paste consisting of silver powders and a binder is inserted into the through-hole to electrically connect both the upper and lower wiring patterns and produce a double-surfaced printed circuit board.

Both of the techniques described above, however, have drawbacks. For example, in the case of the first-mentioned technique, the plating processes involved are rather complicated and not particularly efficient. In addition, there is a problem of disposing of waste water from the plating bath without creating pollution. Since the copper plating is carried out on the entire surfaces of the board and thereafter the wiring patterns are selectively etched, the amount of unnecessary copper plating is rather large. Upon selective etching, the copper plating layer on the substrate can be sufficiently etched to be under-cut, so that the wiring pattern becomes thin and the pattern accuracy is diminished.

In the second-mentioned technique, in which the upper and lower wiring patterns are electrically connected by silver paint inserted through the through-hole, when a DC voltage is applied to the board under conditions of some humidity, silver is moved from a high voltage portion to a lower voltage portion and an undesirable short-circuit is caused by the electromigration tendency of the silver. The through-hole resistance is higher than that of the copper plating by a factor of about 100 times and so the circuit board is poor in high frequency characteristics. Further, since the silver paint charged into the through-hole contains a binder and solvent, the paint shrinks by heat curing, and so the circuit board lacks reliability. In addition, the use of organic solvents and the like causes poor working conditions.

In a prior application, Ser. No. 246,902, filed Mar. 23, 1981, there is described a conductive material made of a mixture consisting of gallium in liquid phase and a metal which forms a eutectic mixture with gallium, together with a metal powder (either a single metal or an alloy powder) which alloys with gallium to raise the melting point of the composition. This conductive material is in the form of a paste at its initial working temperature and thereafter alloys and sets upon the lapse of a suitable time interval. Suitable amounts of liquid gallium and solid metal which form a eutectic with gallium are mixed to provide a molten mixture. After the mixture is cooled to a working temperature, metal powders to be alloyed with the gallium are added to the mixture to prepare a paste in which the metal powder will be finally alloyed with the gallium. The eutectic forming metal can be indium, tin, zinc, bismuth, or the like. The metal powder which alloys with gallium can be pure metal such as copper, nickel, cobalt, or gold, or alloys thereof such as a copper-tin alloy and the like.

The ratio of the ingredients in the composition, consisting of gallium, the eutectic former and the metal alloying powder depend upon the kind of metal which forms the eutectic and the temperature at which the material is to be worked. Since the conductive material containing the gallium alloy consists of a pasty composition at the working temperature, it is readily inserted into the through-hole. There is no volume shrinkage after curing and the resistance value of the inserted material is very low. Thus, the conductive material described in the previous application can be used in a multi-layer circuit board and is also free from the electromigration phenomenon characteristic of silver paste. Therefore, the above-described conductive paste permits a wide variation in printed circuit designs.

It is, however, difficult to keep the conductive material containing gallium in a paste state for a long period of time. This is illustrated somewhat in the diagram of FIG. 1A where a melt 1 of gallium and tin (the eutectic metal) is mixed with a copper-tin powder 2 to be alloyed with the gallium to provide a Ga-Sn-Cu alloy conductive material in the paste state. After the lapse of time, the conductive material shown in FIG. 1A at room temperature is changed so that the gallium reacts with copper to produce gallium-copper intermetallic compounds (such as $Ga_2Cu$, $GaCu_2$, and so on) which are precipitated. In consequence, the paste property is gradually lost. It then becomes difficult to coat or charge the conductive material into the required location, so its characteristics are deteriorated. When the paste property is once lost, it is difficult to restore it, and much valuable material is lost.

SUMMARY OF THE INVENTION

The present invention provides an improved conductive paste suitable for use with a printed circuit board.

In accordance with the preferred embodiment of the invention, a conductive paste is produced by providing a melt of gallium together with a metal element or alloy which forms a eutectic mixture with gallium, the amount of said eutectic former being at least sufficient to reach the limit of solubility of the metal in gallium at a specific temperature. The paste also contains dispersed through it a metal powder which alloys with gallium to provide a higher melting alloy, the alloying metal being covered with a surface coating of the eutectic forming metal.

BRIEF DESCRIPTION OF THE DRAWINGS

A further description of the present invention will be made in conjunction with the attached sheets of drawings, in which.

DESCRIPTION OF THE PREFERRED EMBODIMENTS

Figure 1A:
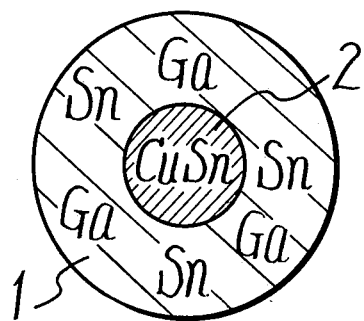
FIGS. 1A and 1B are schematic illustrations of paste-like conductive material composed of gallium and used to explain the present invention.
Figure 1B:
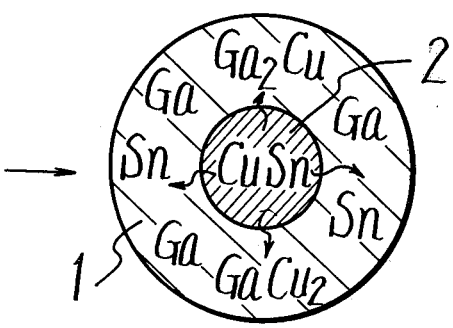
Figure 2:
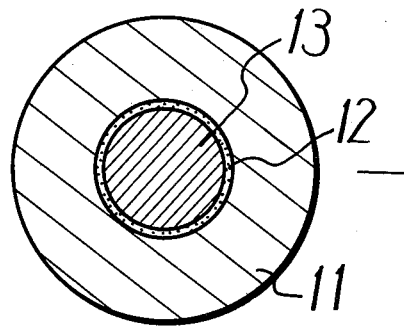
FIG. 2 is a schematic illustration of conductive material produced according to the present invention.
Figure 3:
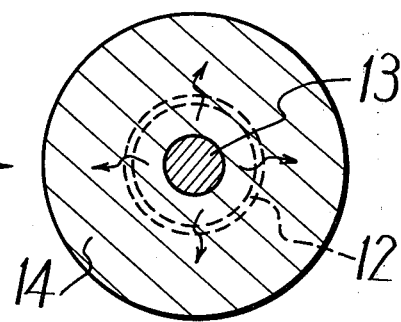
FIG. 3 is a view similar to FIG. 2 showing the manner in which the core of the particle reacts during curing.

According to the present invention, a conductive material is produced by mixing molten gallium with a metal which forms a eutectic mixture with gallium, together with a metal powder consisting of either a single metal or an alloy which is capable of alloying with gallium, the powder being coated with the eutectic forming metal. The eutectic forming metal thus forms a saturated solution in gallium at a predetermined temperature which is less than the working temperature subsequently to be described, or the amount may possibly be more than the saturated amount. This conductive material has a property such that it maintains its paste state at the lower temperature below the working temperature, but a reaction is generated therein during the heating process at the working temperature to produce an alloy which is cured with the passage of time. The metal which forms the eutectic with gallium is molten in the melt consisting mainly of gallium to such an extent that it is saturated so that the coating on the metal powder to be alloyed with gallium cannot be further dissolved in the gallium melt so that the gallium melt does not contact the alloying metal powder. Consequently, the paste state is maintained for a long period of time. If the paste-like conductive material is heated to an elevated working temperature as shown in FIG. 3, the amount of eutectic forming metal which can be dissolved in the melt is increased and the metal layer 12 on the surface of the metal powder 13 is dissolved in the gallium melt. Thus, the metal powder 13 reacts with gallium to produce an intermetallic compound 14 which becomes gradually cured.

The metal which forms a eutectic with gallium can be a combination of one or more of the metals indium, tin, zinc, or bismuth, and is preferably an alloy such as an indium-tin alloy. As the alloy forming metal, we can use a single metal such as nickel, cobalt, gold, copper, or the like, or alloys thereof, for example, a nickel-copper alloy, a cobalt alloy such as a cobalt-tin alloy, a copper alloy such as a copper-tin alloy (containing more than 60% copper), a copper-zinc alloy (containing more than 60% by weight copper), a copper-beryllium alloy (containing more than 98% by weight copper), and the like. It is desirable that the metal powders used have no oxide layer on the surface thereof. Tin, zinc, and beryllium of the above-listed alloying agents are especially preferred to avoid the oxidation of pure copper powder. The grain size of the metal powders should be in the range from about 0.5 to 500 microns, and is preferably from 1 to 100 microns.

The amount of metal forming a eutectic with molten gallium differs in accordance with the type of metal used, the working temperature, and the like. For example, in the case of a working temperature of 30° C., the saturation amount is about 10% by weight in the case of tin, about 6% by weight for zinc, and about 20 weight percent for indium. The amount of eutectic forming metal which covers the surface of the alloying metal powder is enough to at least cover the surface thereof. The thickness of the eutectic metal layer which can cover a metal alloying powder having a grain size of about 40 microns is less than 5 to 6 microns. If the thickness is greater than that, the amount of metal powder to be alloyed with the gallium becomes less than the amount necessary to react with all of the gallium, so that the material does not become hard or cured.

Figure 4:
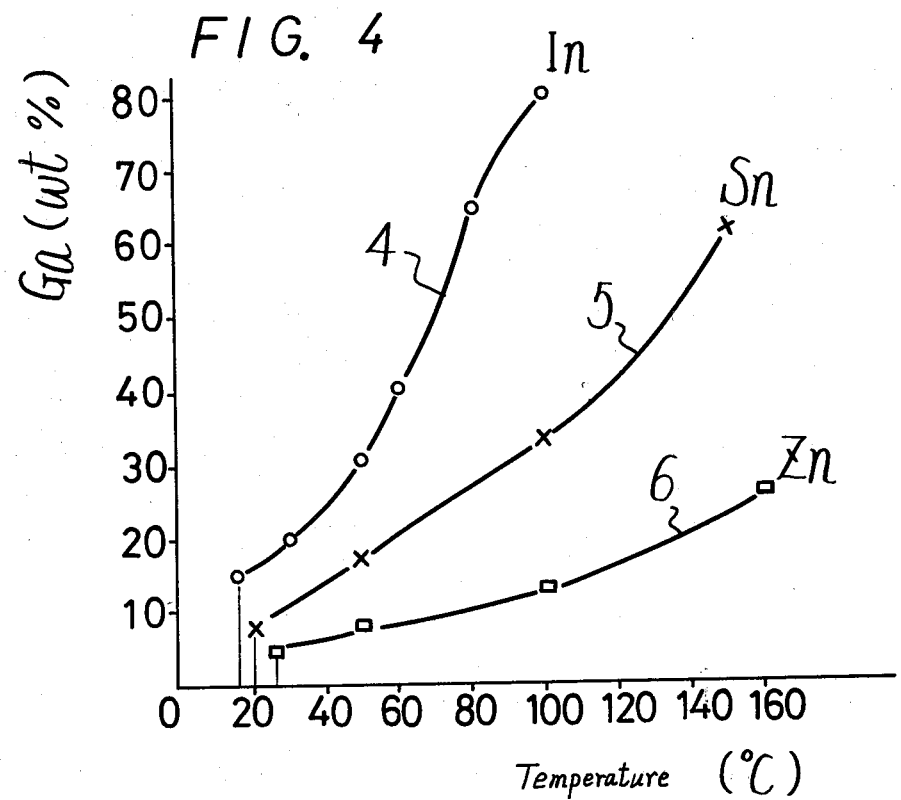
FIG. 4 is a graph illustrating the solubility characteristics of various eutectic forming metals as a function of the temperature of gallium liquid.

FIG. 4 is a graph showing the amount of eutectic forming metal which can be dissolved into the gallium melt at various working temperatures. The curve 4 represents the metal indium, the curve 5 the metal tin, and the curve 6 the metal zinc. From this graph, it will be noted that as the working temperature increases, the amount of eutectic metal which can be dissolved into the gallium melt increases very substantially.

In manufacture of the conductive paste, liquid gallium and solid eutectic forming metal are first weighed and then are heated in a crucible to a temperature higher than the melting point of the metal forming the eutectic mixture with gallium and thereby melted. The melt thus prepared is cooled to a predetermined temperature such as room temperature and then a metal powder which alloys with gallium and is covered on its surface by a coating of the above-defined eutectic forming metal is then added to the melt. The alloying powder is dispersed well within the melt and mixed, for example, by means of an amalgam mixer, a vibration mill or the like to provide the desired conductive paste.

The ratio of components of gallium, eutectic former, and metal alloying powder differs depending upon the kind of metal used as the eutectic former and the working temperature that can be determined through the use of graphs such as that shown in FIG. 7, which will be described later.

Figure 5:
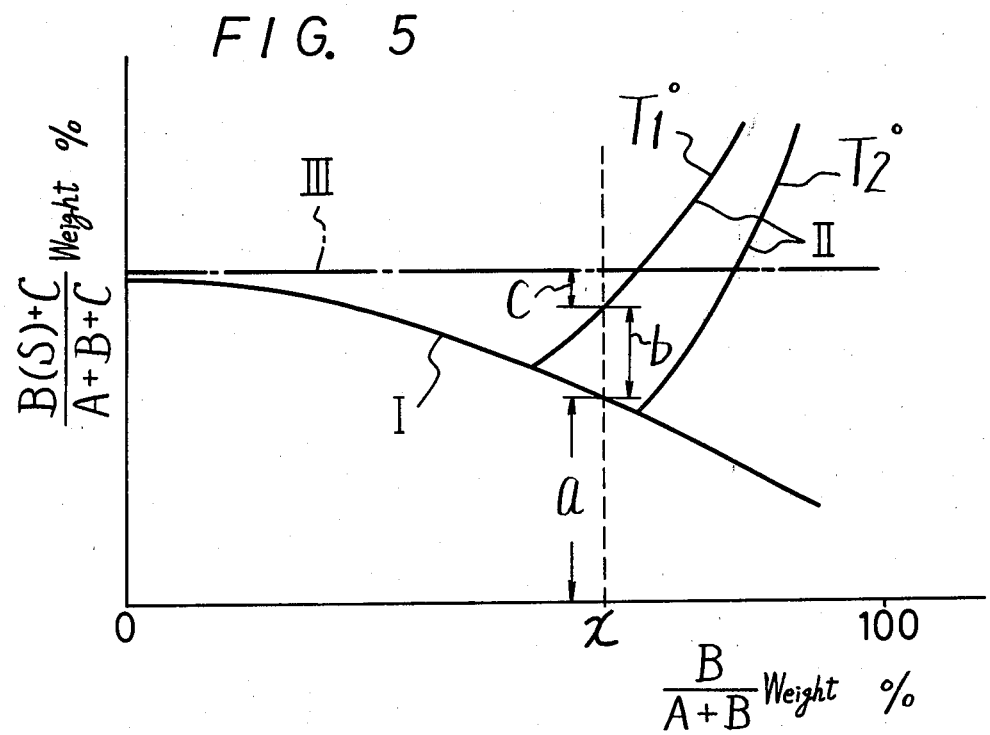
FIG. 5 is a graph showing the relationship between the alloy composition and the working temperature.

FIG. 5 is a graph showing the relationship between a generalized alloy composition and its working temperature. In the graph of FIG. 5, the amount of gallium is identified as A, the metal forming the eutectic mixture with gallium is identified as B, and the metal powder coated on its surface with the eutectic forming metal and alloying with the gallium is identified as C. The abscissa represent the weight ratio $$\frac{B}{A+B}$$

of the melt, and the ordinates represent the weight ratio $$\frac{B(s)+C}{A+B+C}$$

of the solid components for the total amount of A, B and C, where B(s) is the amount of the precipitated crystals of B and C is the metal powder added for alloying. In the graph of FIG. 5, the curve I shows the minimum amount of C necessary for reacting with the component A. Curves II show the relation between the added amount of B for the total amount of A+B, $$\left(\frac{B}{A+B}\right)$$

and the precipitated amount $$\left(\frac{B(s)}{A+B}\right)$$

of the B component at respective working temperatures, $T_1°$ C., $T_2°$ C., and so on. Curve III shows the optimum paste conditions for the conductive metal or its optimum solid content ratio $$\frac{B(s)+C}{A+B+C}$$

which represents the optimum softness of the paste. Accordingly, if the amount of B is identified as x, and the working temperature is $T_1°$ C., the necessary minimum amount of C becomes the amount identified as a in the graph, the precipitated amount f the B component is identified as b, and the amount of C component necessary for obtaining an optimum paste condition is identified as c. Thus, the added amount of C component is the value a plus c.

The ratio B $$\frac{B}{A+B}$$

can be increased as the working temperature increases. Depending on the alloy composition, the ratio should be more than about 20 weight percent at a working temperature of 120° C., which is a desirable critical working temperature. In the case of tin, the amount should be lower than 70 weight percent, and in the case of indium it should be lower than 90 weight percent. If the amount is less than 20 weight percent, the malleability after hardening of the paste becomes poor and the conductive material tends to become brittle.

The added amount of the C component depends upon the amount of B component and the working temperature. There should be a sufficient amount together with the B component to make the softness ratio $$\frac{B(s)+C}{A+B+C}$$

in the range of 30 to 50 weight percent at the working temperature. In general, the amount of C component added should be more than 10 weight percent but lower than 50 weight percent. When the amount of C component added is less than 10 weight percent, unreacted gallium remains and hence the paste does not harden. If the amount of C component added exceeds 50 weight percent, no paste condition is produced and accordingly, the conductive material cannot properly be charged into the through-hole.

The softeness ratio is preferably more than 30% but less than 50%, and is preferably about 40%. The working temperatures selected are in the range from $-10°$ C. to 120° C., and are preferably between 20° C. and 80° C.

The mixing temperature of the three components depends on the alloy composition and the working temperature and depends mainly on the kind of B component used. In FIG. 7, the B component is tin. The mixing temperature is such that the mixed components retain their liquid phase and should be in the range below the optimum paste condition curve I shown in the graph of FIG. 5.

The following table shows desirable mixing temperatures in the situation where tin is used as the B component.

| $\frac{Sn}{Ga+Sn}$ | 30% | 40% | 50% | 70% |
|---|---|---|---|---|
| Mixing Temperature | Higher than 30° C. | Higher than 50° C. | Higher than 80° C. | Higher than 120° C. |

Where more than one B component is added, the mixing temperature becomes rather low.

Figure 6:
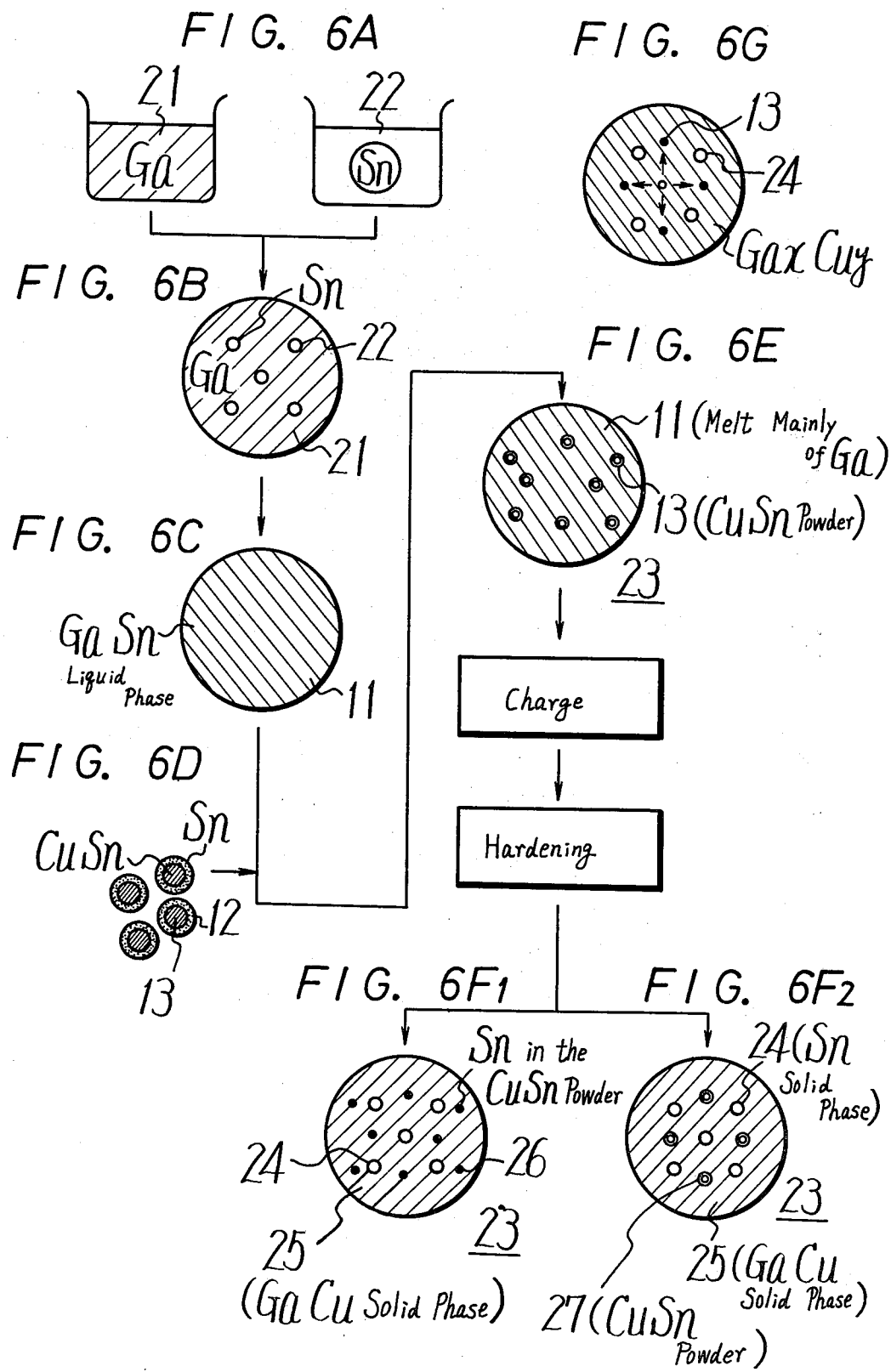
FIGS. 6A to 6G are diagrams used to illustrate the manufacture of the conductive materials of the present invention.

The method of preparing the conductive paste of the present invention will be illustrated in conjunction with FIG. 6 which shows the steps involved in making a gallium-tin-copper alloy according to the present invention. The first steps as shown in FIGS. 6A and 6B, liquid gallium 21 and solid tin 22 are separately weighed to provide, for example, 40 parts by weight of gallium and 15 parts by weight of tin and then mixed at a temperature higher than the melting temperature, 232° C., of tin. After the mixture has been heated to be molten, as shown in FIG. 6C, the liquid phase 11 is cooled to a predetermined working temperature such as 30° C. At the working temperature 30° C., the tin 22 in the melt causes the gallium melt to be saturated, and excessive tin is precipitated. The melt 11 is then treated with, for example, 50 parts by weight of copper-tin alloy powder 13 which has been coated on its surface by means of a layer of tin 12 having a thickness of about 3 microns to produce a conductive material 23 as shown in FIG. 6E. In this conductive material 23, the gallium is saturated with tin, and the tin coating 12 on the surface of the copper-tin powder 13 is not rendered molten. Thus, the copper in the alloying powder 13 does not react with the gallium and the paste condition is maintained.

Next, the paste or conductive material 23 is charged into the desired portion of the circuit board, subjected to heating and held at a sufficiently high temperature, for example, 120° C. for one hour so that the tin coating 12 on the surface of the copper-tin powder is dissolved into the melt 11 and thereafter is hardened. As shown in FIG. 6G, the tin coating 12 on the surface of the copper-tin powder is rendered molten and the copper in the powder 13 is dispersed into the gallium melt to produce an alloy consisting of various intermetallic compounds having the general designation $Ga_xCu_y$, for example, $Ga_2Cu$, $GaCu_2$, and the like. The paste 23 becomes alloyed and hardened as time elapses. During this hardening if the amount of the copper-tin powder has been suitably selected, as shown in FIG. 6F$_1$, a solid phase 24 whose main component is tin, a solid phase 25 whose main component is gallium-copper, and tin powder 26 from the original copper-tin alloy are present in the conductive material 23. If the amount of copper-tin powder 13 is excessive, as shown in FIG. 6F$_2$, the solid phase 24 whose main component is tin, a solid phase 25 whose main component is gallium-copper, and a copper-tin powder 27 which is not reacted exist in admixture. When such a material is hardened, almost all of the mixed tin is precipitated, the copper which has not reacted with the gallium is also precipitated, and a relatively brittle gallium-copper compound exists.

Figure 7:
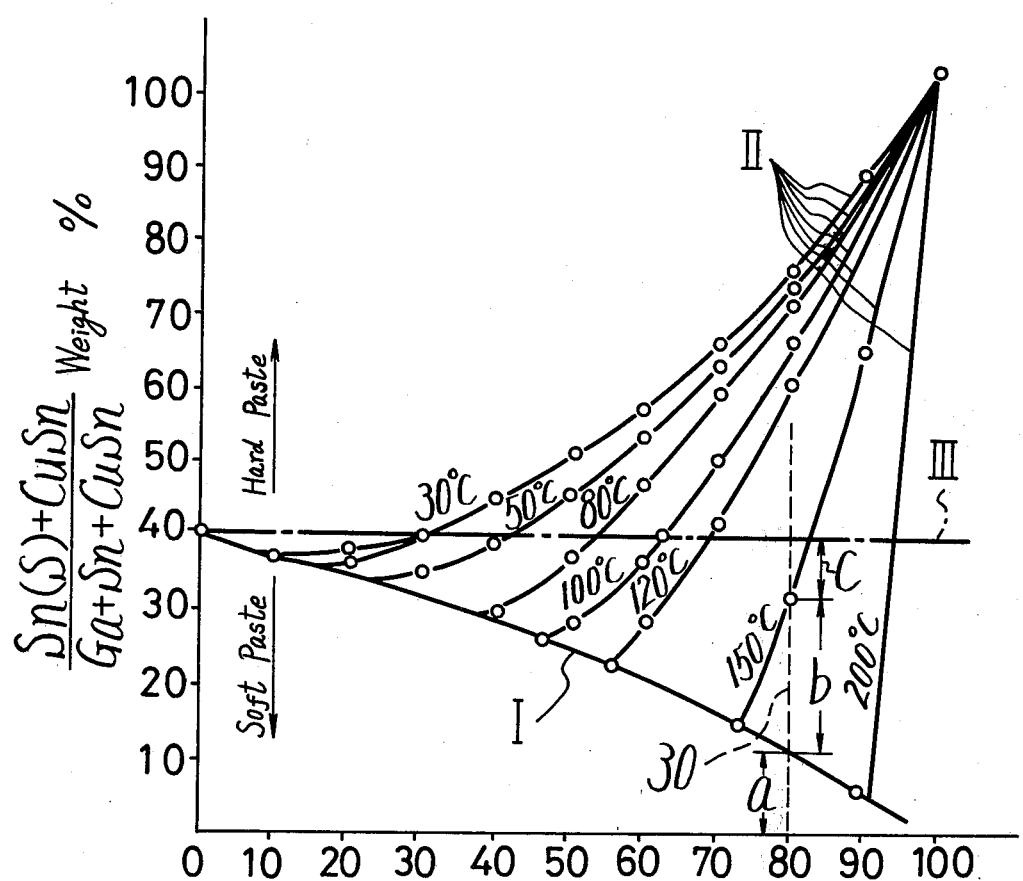
FIG. 7 is a diagram showing the relationship between the alloy composition of a Ga-Sn-Cu system alloy and various working temperatures.
Figure 8A:
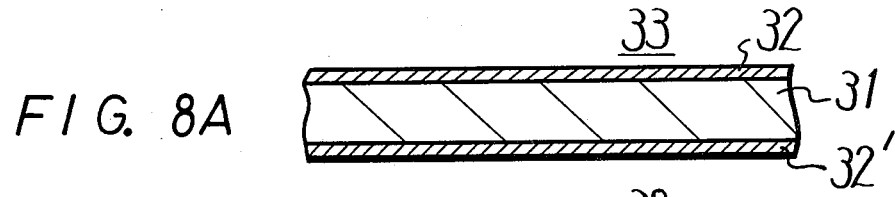
FIGS. 8A to 8D are enlarged cross-sectional views showing the manner in which the conductive material of the present invention can be employed to manufacture a multi-layered printed circuit board.
Figure 8B:
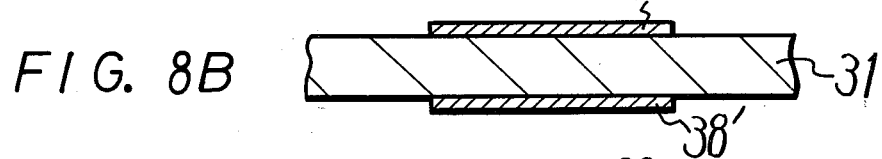
Figure 8C:
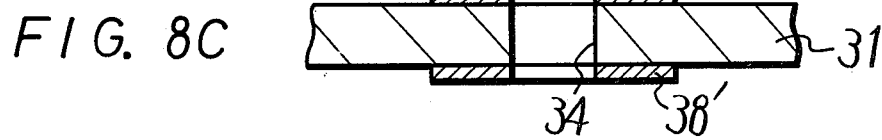
Figure 8D:
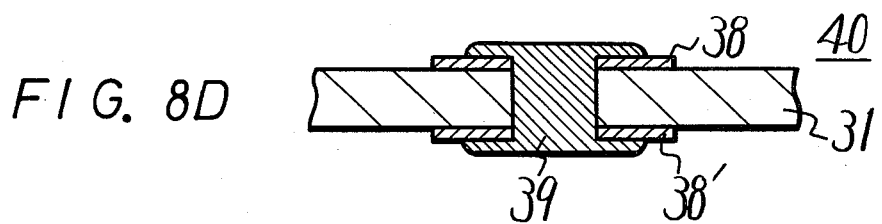

FIG. 7 is a graph showing the relationship between the alloy composition of gallium-tin-copper for the same type of system as is shown in FIG. 5. Such a composition may include copper powder of a particle size of 40 microns thickness in an amount of 90 percent by weight coated on its surface with 10 percent by weight of tin having a thickness of 1 micron. According to the alloy graph of FIG. 7, when 80 weight percent tin and 20 weight percent gallium are mixed and melted at, for example, 235° C. and then the temperature reduced to a working temperature of 150° C., the crystallized part b of tin is 20 weight percent, and the minimum necessary portion of copper powder, a, which reacts with gallium is 11 weight percent. The paste porosity adjusting portion c of copper powder is 8 weight percent as indicated by a dashed line 30. Consequently, a copper powder of a total concentration of 19 percent by weight is necessary. Accordingly, the respective composition ratios of gallium-tin-copper alloy under the above conditions are obtained. In the graph of FIG. 7, the paste in the region above the optimum paste state line III becomes hard, while the paste in the region below that line III becomes soft. It should be understood that if the above composition is used at a temperature lower than 150° C., the paste becomes hard but if the composition is at a temperature higher than 150° C., the paste becomes too soft and becomes hard to charge. The respective composition ratios of gallium, eutectic metal, and alloying powder in the case where the eutectic metal is indium, zinc, or bismuth can be determined based on the relation diagram of the alloy composition and the working temperature.

In FIG. 8, there is shown an example of the invention in which the conductive material of the present invention is used to make a multi-layer printed circuit board. As shown in FIG. 8A, a copper clad laminate 33 is prepared consisting of an insulating board 31 composed, for example, of a phenolic resin, an epoxy resin, or ceramic or the like, and copper foils 32 and 32' are adhered on the upper and lower surfaces of the board 31, respectively. The upper and lower copper foils 32 and 32' are etched away to form predetermined wiring patterns 38 and 38' on both surfaces of the board 31 as shown in FIG. 8B. A through-hole 34 is bored at a predetermined position through the board 31, the hole passing also through the wiring patterns 38 and 38' as shown in FIG. 8C. Thereafter, a conductive material of paste form, consisting of gallium, the eutectic forming metal, and metal powder coated on its surface with the eutectic metal, is charged into the through-hole 34. Then, the conductive material is alloyed and hardened by heat to provide a conductor 39 which electrically connects both the wiring patterns 38 and 38'. There results a multi-layer printed circuit board 40 as shown in FIG. 8D.

Figure 12:
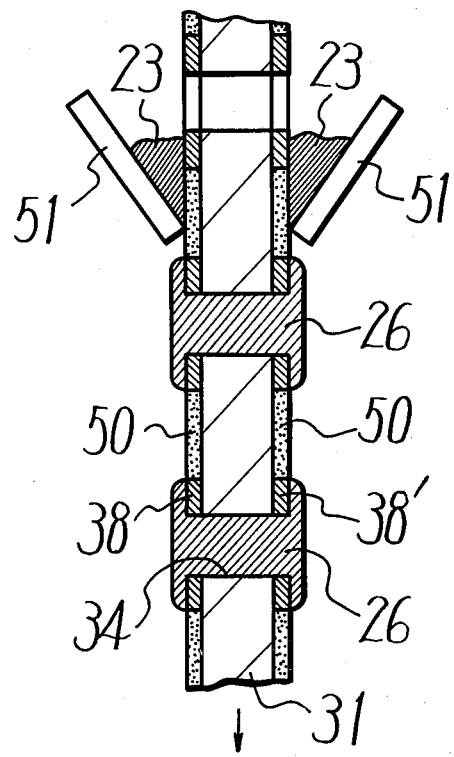
FIGS. 12 and 13 represent two manners for charging the conductive material of the present invention into the through-hole of the printed circuit board.

A further modified form of the invention is shown in FIG. 12. That figure illustrates a board 31 which is provided with copper patterns 38, 38', a through-hole 34, and resist layers 50 which are coated on the surfaces of the board 31 in the areas in which the patterns 38, 38' are not formed. A pair of fixed trowels 51 are located on opposite sides of the board. As the board 31 is moved in the direction indicated by the arrow, the conductive material paste 23 is charged into the through-hole 34. The conductive material does not adhere to the coating layer of organic material making up the resist 50 but is coated on the copper patterns 38, 38' to wet the same and is then received in the through-hole 34.

Figure 13:
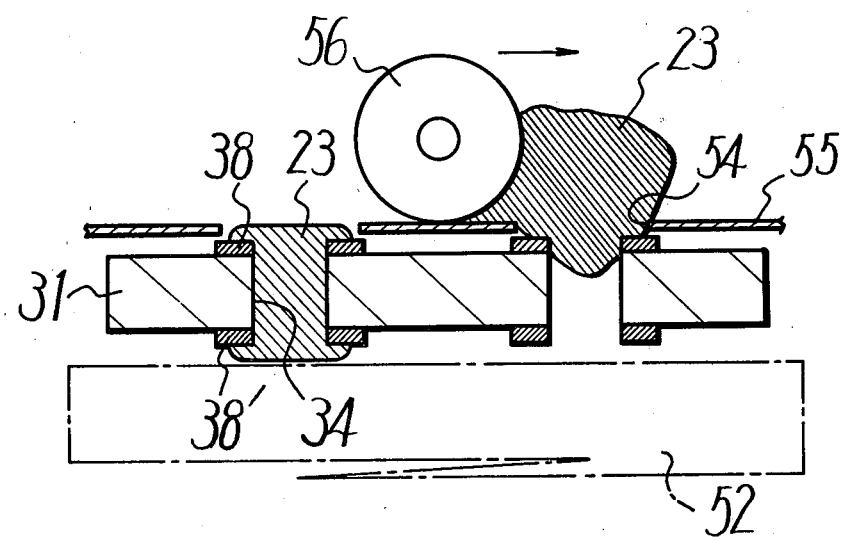

As shown in FIG. 13, the board 31 provided with copper patterns 38, 38' and through-hole 34 may be located on a hot plate 52 and a mask 55 composed of a sheet of stainless steel, vinyl chloride resin or the like having bores 54 overlying the through-hole 34 and a portion of the copper pattern 38, 38' is fixed above one surface of the board 31. The conductive material 23 is charged from above the mask 55 by means of a roller 56 composed, for example, of a silicone gum. After the charging of the conductive material 23, the mask is removed and the conductive material 23 is charged into the through-hole 34 and does not adhere to other portions. It is desirable that after the conductive material 23 has been charged into the through-hole 34, that parts of the conductive material 23 which protrude from the through-hole are removed and smoothed, if necessary. After the charging of the conductive material 23 into the through-hole 34, the paste is set under heat in the lapse of time, and loses its paste-like property.

It was determined that after the conductive material 23 was charged and cured, and the circuit board 40 was immersed in a soldering bath where the temperature of the solder was 240° C. for 10 seconds, no change occurred in the hardened conductive material. After such a cycle, the circuit board 40 was immersed into polysiloxane oil at 260° C. for 5 seconds and then immersed in trichloroethane solution at 20° C., the cycle being repeated 10 times, no change occurred in the through-hole resistance value or the cross-sectional shape of the cured conductive material. The through-hole resistance value was 0.2 milliohms, similar to a copper plated through-hole.

A paper board impregnated with phenolic resin was provided with two through-holes at a distance of 5 mm.

The above conductive material was charged into the two through-holes and then hardened. Afterwards, 100 volts DC was applied across each of the conductors in the two through-holes, and left for 2000 hours under conditions of 95% relative humidity at 40° C. After the above test, no electro-migration phenomenon occurred, and the insulating property was not deteriorated.

As evident from the foregoing, the present invention provides a manufacturing process which is shortened and less expensive as compared with other prior art processes for plating the through-holes and the like. Furthermore, there is no waste water disposal problem since the invention requires no plating process.

When the present invention is compared with the silver through-hole method in which silver paint is charged into the through-hole, the reliability of the present invention is improved at every point. The through-hole resistance value of the material of the present invention is less than that of the silver through-hole method by a factor of 100 or more so that the invention provides a material which is good in high frequency characteristics, has no electro-migration phenomenon, and can be used in a wide variety of circuit design since the deposit of the present invention contains no silver.

In addition, the conductive material of the invention does not contain any volatile components in the paste, so that no shrinkage is generated as the paste hardens.

It was also determined that the metal which forms the eutectic mixture with gallium is contained largely in the conductor, and the gallium reacts with the alloying metal such as copper to become hardened and that brittle gallium-copper intermetallic compounds are dispersed in the metal which forms the eutectic mixture with gallium to provide malleability.

Figure 9:
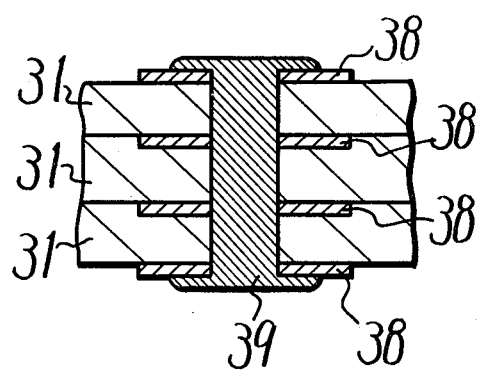
FIGS. 9, 10 and 11 are cross-sectional views illustrating other multi-layered printed circuit boards to which the present invention can be applied.
Figure 10:
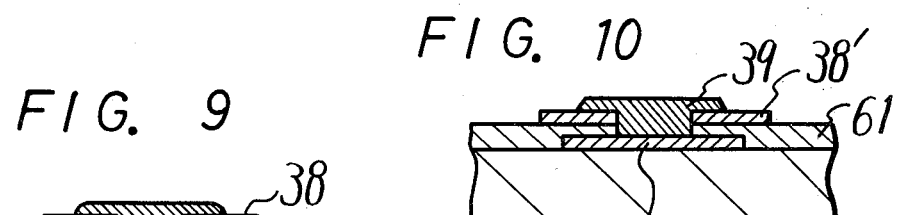

In the example shown in FIG. 8, the conductive material was applied to a two-layer printed circuit board with wiring patterns 38 and 38' on opposite sides of the board 31. However, the conductive material according to the present invention can also be applied to a multi-layer printed circuit board such as a printed circuit board which is provided with wiring patterns 38 as four layers as shown in FIG. 9. It can also be applied to a simple type circuit board as shown in FIG. 10, consisting of an insulating board 60 having a first wiring pattern 38, an insulating layer 61 and a second wiring pattern 38' formed sequentially on the insulating board 60. Another application as shown in FIG. 11 involves a simple type circuit board consisting of a hard insulating board 62, a first wiring pattern 38 formed thereon, and a flexible circuit board 63 comprising a flexible insulating board with a second wiring pattern 38' formed on the first wiring pattern 38.

Figure 14:
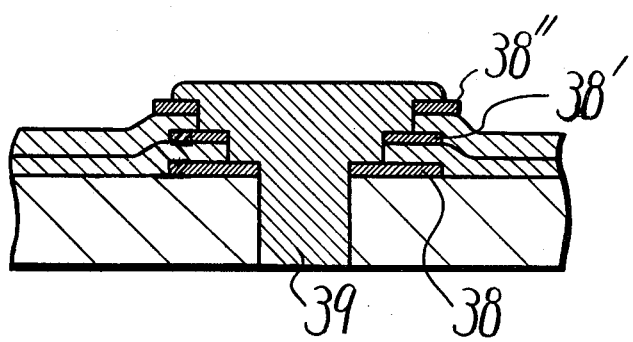
FIG. 14 is a cross-sectional view on an enlarged scale of a further example of a multi-layered printed circuit board to which the present invention is applicable.
Figure 11:
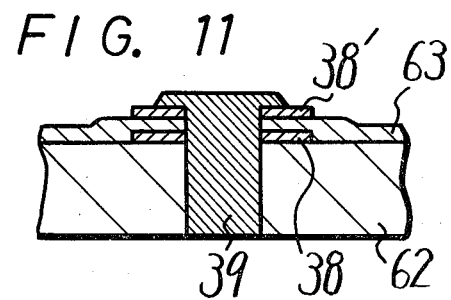

In the multi-layer circuit printed boards shown in FIGS. 10 and 11, the number of laminated layers can be increased to more than three. In such cases a shown in FIG. 14, if the dimension of the aperture of the patterns is made progressively larger from the first pattern 38 to patterns 38' and 38" laminated on the former and spaced by about 0.1 to 2 mm, the electrical connection between the respective patterns is improved.

Furthermore, it is possible to provide copper foils or flexible boards on both surfaces of the insulating boards 60 and 62 in the simple type circuit boards shown in FIGS. 10 and 11.

In the above examples, the conductive material produced according to the invention is employed as the charging material for the through-hole of a multi-layer printed circuit board. The material of the present invention can also be used as an ordinary soldering material and can further be employed where the conductive layer or wires having a desired pattern are formed on a board by printing.

Since the conductive material including the gallium alloy is in such a state that the metal powder of the alloy does not react with gallium in the melt, the paste can be maintained for a long period of time.

It will be evident that many modifications and variations can be effected by one skilled in the art without departing from the scope or spirit of the novel concepts of the present invention.

We claim as our invention:

1. A conductive paste comprising:
   a continuous phase of metallic gallium in combination with a first metal which forms a eutectic with gallium, said metal being present in excess of its solubility limit in gallium at a predetermined temperature,
   in combination with a second metal powder capable of alloying with gallium, said powder being pre-coated with said first metal and being dispersed through said continuous phase.

2. A conductive paste according to claim 1 in which:
   said first metal includes indium, tin, zinc, or bismuth, or an alloy thereof.

3. A conductive paste according to claim 1 in which said second metal is copper, nickel, cobalt, gold, or an alloy of such metal.

4. A conductive paste according to claim 2 which contains about 10% by weight tin.

5. A conductive paste according to claim 2 which contains about 6% by weight zinc.

6. A conductive paste according to claim 2 which contains about 20% by weight indium.

7. A conductive paste according to claim 1 in which:
   said metal powder has a size of from 0.5 to 500 microns.

8. A conductive paste according to claim 1 in which:
   said metal powder has a size of about 10 to 100 microns.

9. A method for making a conductive composition which comprises:
   providing a molten mixture of gallium and a first metal which forms a eutectic with gallium at a temperature in excess of the melting point of said metal,
   cooling the resulting melt to a lower temperature,
   adding to the cooled melt a powder having a central core of a second metal or alloy capable of alloying with gallium to form a gallium alloy of a higher melting point than the gallium itself, said core being pre-coated with said first metal, and
   agitating the resulting mixture to disperse said powder within said melt.

10. A method according to claim 9 in which said first metal includes indium, tin, zinc or bismuth.

* * * * *